US 9,559,713 B1

(12) United States Patent
Wu et al.

(10) Patent No.: US 9,559,713 B1
(45) Date of Patent: Jan. 31, 2017

(54) DYNAMIC TRACKING NONLINEARITY CORRECTION

(71) Applicant: Broadcom Corporation, Irvine, CA (US)

(72) Inventors: Rong Wu, Irvine, CA (US); Tianwei Li, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 15/057,609

(22) Filed: Mar. 1, 2016

Related U.S. Application Data

(60) Provisional application No. 62/298,580, filed on Feb. 23, 2016.

(51) Int. Cl.
*H03M 1/00* (2006.01)
*H03M 1/12* (2006.01)
*H03M 1/06* (2006.01)

(52) U.S. Cl.
CPC ........... *H03M 1/124* (2013.01); *H03M 1/0612* (2013.01)

(58) Field of Classification Search
CPC ...... H03M 1/1245; H03M 1/129; H03M 1/10; H03M 1/08; H03M 7/005; H03M 1/1009; H03M 1/1061; H03M 1/12; H03M 1/124; H03M 1/0836
USPC ................ 341/155, 163, 118, 120, 138, 139, 140,341/122
See application file for complete search history.

(56) References Cited

U.S. PATENT DOCUMENTS

| | | | | |
|---|---|---|---|---|
| 5,500,612 A | * | 3/1996 | Sauer | G11C 27/02 327/390 |
| 6,744,832 B2 | | 6/2004 | Miao | |
| 8,217,821 B2 | * | 7/2012 | David | G05F 3/08 323/268 |
| 9,143,146 B1 | | 9/2015 | Pereira et al. | |
| 9,210,363 B2 | | 12/2015 | Reddy et al. | |
| 9,294,112 B1 | * | 3/2016 | Devarajan | H03M 1/121 |
| 2005/0258996 A1 | * | 11/2005 | Lee | H03M 1/1245 341/155 |
| 2011/0267211 A1 | * | 11/2011 | Oshima | H03M 1/1038 341/118 |
| 2013/0314128 A1 | * | 11/2013 | Hensley | H03K 17/687 327/93 |
| 2015/0109161 A1 | * | 4/2015 | Trampitsch | H03K 17/063 341/172 |

(Continued)

OTHER PUBLICATIONS

Xu, B., et al., Background Calibration of Time-Interleaved ADC Using Direct Derivative Information, 2013 IEEE International symposium on Circuits and Systems (ISCAS), May 19-23, 2013, pp. 2456-2459, IEEE, Piscataway, New Jersey.

(Continued)

Primary Examiner — Linh Nguyen
(74) Attorney, Agent, or Firm — Brinks Gilson & Lione

(57) ABSTRACT

An analog-to-digital converter (ADC) is used for dynamic tracking nonlinearity correction. The correction employs an analog sampling technique to determine the signal derivative by measuring the derivative current arising from sampling an analog input signal undergoing analog-to-digital conversion, at the sampling instant. The analog derivative sampling technique achieves significant reduction in power consumption with less complexity compared with a digital approach, with strong improvements in $HD_3$, SDFR, and $IM_3$ measures.

20 Claims, 7 Drawing Sheets

(56) References Cited

U.S. PATENT DOCUMENTS

2015/0188533 A1\* 7/2015 Viswanath ........... H03K 17/063
378/9
2016/0027528 A1\* 1/2016 Verbruggen ........... G11C 27/02
341/122

OTHER PUBLICATIONS

Nikaeen, P., et al. Digital Compensation of Dynamic Acquisition Errors at the Front-End of High-Performance A/D Converters, IEEE Journal of Selected Topics in Signal Processing, vol. 3, No. 3, Jun. 2009, pp. 499-508, IEEE, Piscataway, New Jersey.
Sonkusale, S.R., et al., A Low Distortion MOS Sampling Circuit, IEEE International Symposium on Circuits and Systems, No. 5, IEEE, 2002, pp. 585-588, Piscataway, New Jersey.
MT-053 Tutorial, Op Amp Distortion: HD, THD, THD + N, IMD, SFDR, MTPR, 2009, pp. 1-8, Analog Devices, Inc., Norwood, Massachusetts.
Henn, C., Intermodulation Distortion (IMD) Application Bulletin, Apr. 1994, pp. 1-9, Burr-Brown Corporation, Tucson, Arizona.
Beavers, I., Technical Article MS-2660, Understanding Spurious-Free Dynamic Range in Wideband GSPS ADCs, 2014, pp. 1-4, Analog Devices, Inc., Norwood, Massachusetts.

\* cited by examiner

DYNAMIC TRACKING NONLINEARITY CORRECTION

PRIORITY CLAIM

This application claims priority to provisional application Ser. No. 62/298,580, filed Feb. 23, 2016, which is entirely incorporated by reference.

TECHNICAL FIELD

This disclosure relates to analog-to-digital converters.

BACKGROUND

Rapid advances in electronics and communication technologies, driven by immense customer demand, have resulted in the widespread adoption of electronic devices of every kind. The analog-to-digital converter (ADC) is a fundamental circuit component of these devices. ADCs have a wide range of circuit applications, and for instance provide a key building block for full band capture and other applications in devices such as cable modems, set-top boxes, WiFi, cellular handsets, cellular base stations, Ethernet, and many other devices. At high input frequency and large signal amplitude, ADCs experience dynamic tracking non-linearity which limits overall linearity of the ADC. Because dynamic tracking non-linearity is frequency dependent, it cannot be calibrated with static non-linearity correction mechanisms. Improvements in ADC design that determine and calibrate for dynamic tracking error will further enhance the capabilities of ADCs and the devices that rely on analog to digital conversion.

DETAILED DESCRIPTION

Figure 1:
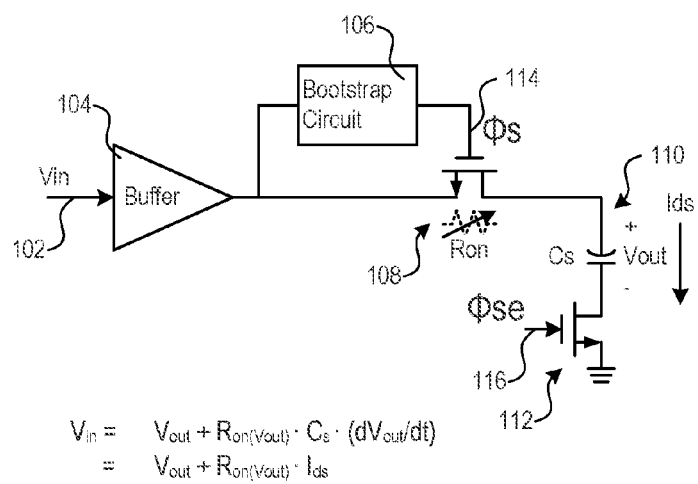
FIG. 1 shows analog-to-digital sample-and-hold circuitry.

FIG. 1 shows analog-to-digital sample-and-hold circuitry 100. An analog signal input 102 connects to an input buffer 104. Following the buffer 104 is a bootstrap circuit 106 that controls the gate of a bottom-plate switch 108. The input voltage sampling transistor 108 has a non-linear channel resistance, $R_{on}$, that is a physical operating characteristic of the bottom-plate switch 108. Also present is a sampling capacitor 110 followed by a top-plate switch 112.

The bootstrap circuit 106 may, for instance, generate a late clock on a late clock input 114 coupled to the bottom-plate switch 108. Note also that an early clock input 116 is coupled to the top-plate switch 112. The early clock input 116 carries an early clock that is advanced with respect to the late clock to perform bottom-plate sampling. The late clock for the bottom-plate switch 108 is labeled $\phi s$, and the early clock is labeled $\phi se$.

Figure 2:
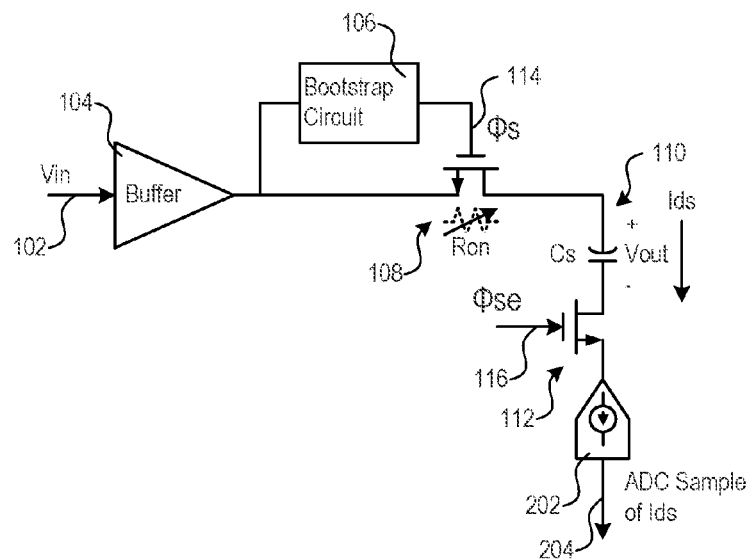
FIG. 2 illustrates analog-to-digital sample-and-hold circuitry with derivative current measurement.

FIG. 2 shows analog-to-digital sample-and-hold circuitry 200 with derivative current measurement. In FIG. 2, a current sampling analog-to-digital converter (ADC) 202 is in series with the sampling capacitor 110. The current sampling ADC 202 converts a derivative current, $I_{ds}$, flowing through the non-linear resistance and the sampling capacitor 110 to a digital representation. The current sampling ADC 202 provides the digital representation on a sampling output 204 to error correction circuitry (discussed below). In one implementation the current sampling ADC 202 is a 7 bit ADC. Note however that the current sampling ADC 202 may convert to fewer or additional bits depending on the conversion resolution used in the error correction circuitry.

The derivative current is labeled in FIG. 2 as the current $I_{ds}$. Note that the analog input voltage, $V_{in}$, is sampled on to the sampling capacitor 110 as a digital output, $V_{out}$. Given the non-linear resistance $R_{on}$ and the derivative current $I_{ds}$, the relationship between $V_{in}$ and $V_{out}$ includes a dynamic tracking error:

$$V_{in} = V_{out} + R_{on(Vout)} \cdot I_{ds}$$

and, because $I_{ds}$ is a current due to the time derivative of the voltage across the sampling capacitor 110:

$$V_{in} = V_{out} + R_{on(Vout)} \cdot C_s \cdot (dV_{out}/dt)$$

The current sampling ADC 202 measures the derivative current at the sampling instant (when $\phi se$ falls) in order to facilitate correction, by succeeding error correction circuitry, to the output of a main-path ADC that converts $V_{in}$. The current sampling ADC 202 does so in a less complex and costly manner that consumes less power compared, e.g., to a complex multi-tap digital interpolation filter that determines an approximation to the signal derivative, particularly at high sample rates and under-sampled scenarios.

Figure 3:
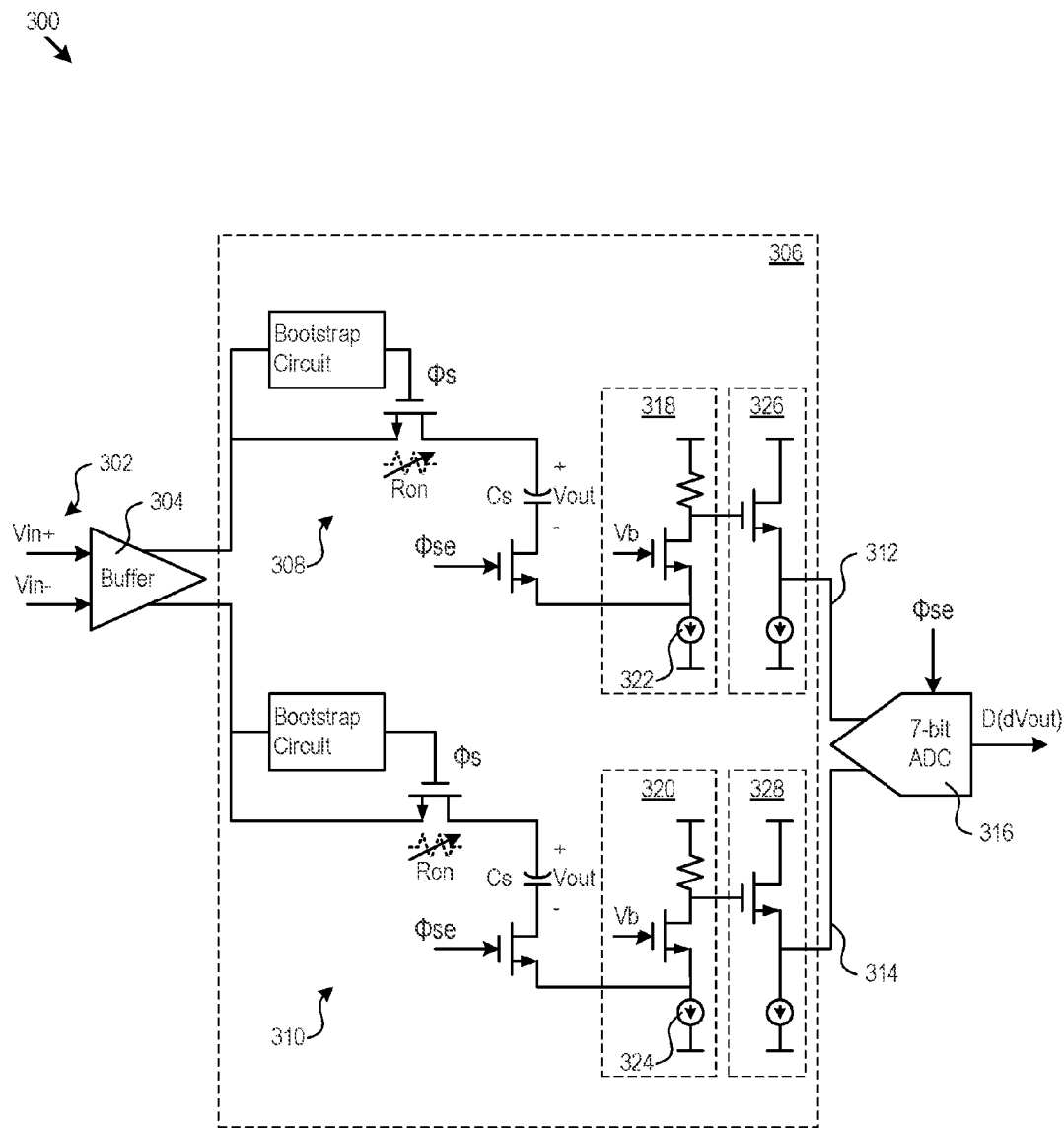
FIG. 3 illustrates differential analog-to-digital sample-and-hold circuitry with derivative current measurement.
Figure 4:
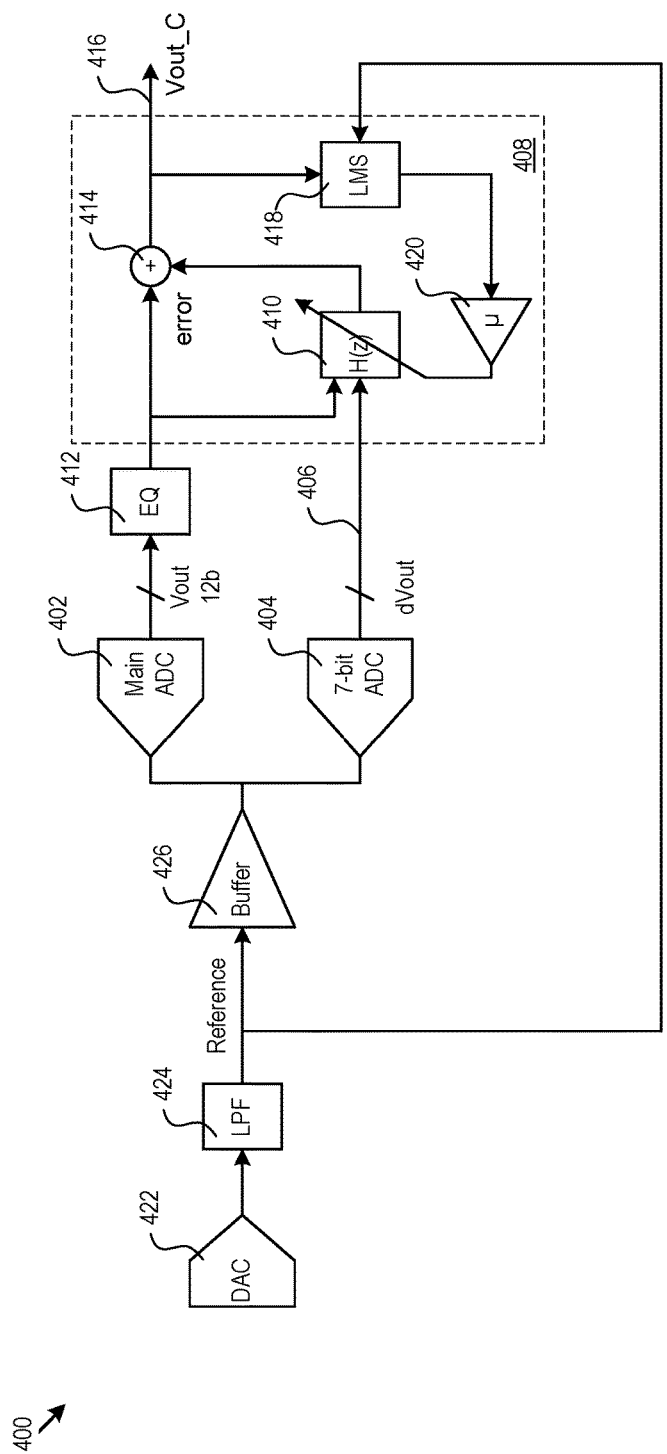
FIG. 4 illustrates main-path analog to digital conversion and auxiliary path analog to digital conversion for derivative current measurement and error correction circuitry.
Figure 5:
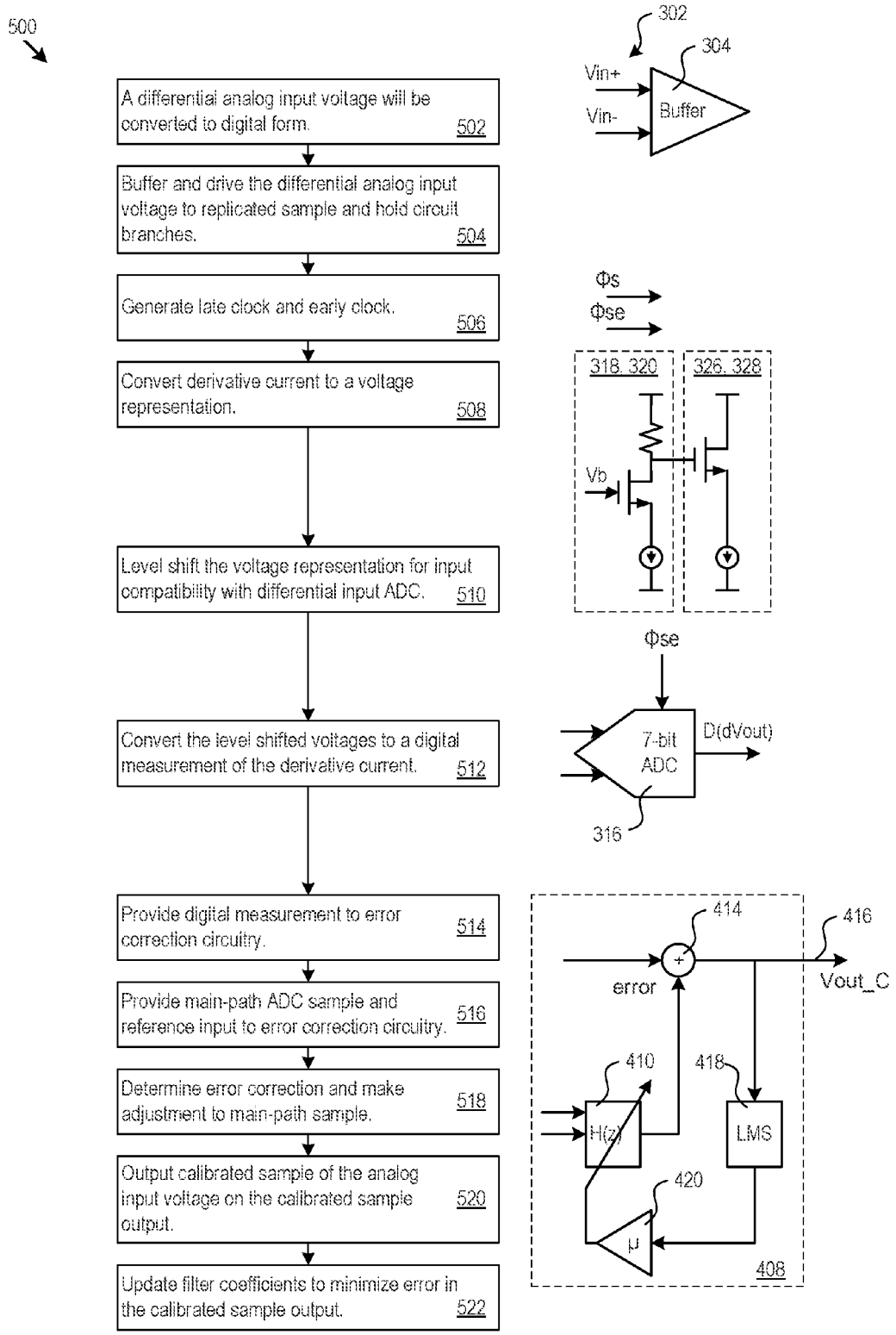
FIG. 5 shows a flow diagram for dynamic tracking calibration.

FIG. 3 illustrates differential analog-to-digital sample-and-hold circuitry 300 with derivative current measurement. FIG. 4 depicts a system overview of dynamic tracking calibration 400. FIGS. 3 and 4 are described in detail below with reference also to FIG. 5, which shows the signal processing flow diagram for tracking calibration 500 that circuitry may implement for derivative current measurement and correction.

FIG. 3 shows a differential implementation of the auxiliary path for derivative current measurement. In the differential implementation, the differential analog input voltage is provided on the $V_{in+}$ and $V_{in-}$ differential inputs 302 (502). A differential input buffer 304 buffers and drives the differential inputs 302 to the differential analog-to-digital sample-and-hold circuitry 306 ("circuitry 306") (504). The circuitry 306 includes independent sampling branches 308 and 310.

Each of the independent sampling branches 308, 310 may replicate, e.g., the analog-to-digital sample-and-hold circuitry 100. The branches 308 and 310 provide differential derivative current sampling outputs 312 and 314 to the differential input ADC 316 (which has a singled ended digital output). In more detail, the independent sampling branches 308, 310 include the bootstrap circuitry, the bottom-plate switches (with non-linear channel resistance, $R_{on}$), sampling capacitors, and top-plate switches. Together, the late clock for the bottom-plate switch, $\phi s$, and the early clock, $\phi se$, control sampling of the analog input voltage. Clock generation circuitry controls the relationship between $\phi s$ and $\phi se$, and the differential input ADC 316 receives the early clock, $\phi se$, for measuring the derivative current at the sampling instant of the analog input voltage (506).

In addition, the independent sampling branches 308, 310 also include current-to-voltage conversion circuitry 318, 320 between the sampling capacitors and the differential input ADC 316. The current-to-voltage conversion circuitry 318, 320 converts the individual differential derivative current components to a voltage representation (508). Note that the current sources 322, 324 preferably have high output impedance.

The voltage representations are inputs to the level-shifting circuitry 326, 328 that is between the current-to-voltage conversion circuitry 318, 320 and the differential input ADC 316. The level-shifting circuitry 326, 328 adjusts the voltages for voltage level compatibility with the differential input ADC 316, and may also provide drive for those voltages into the differential input ADC 316 (510). The current-to-voltage conversion circuitry 318, 320 and the level-shifting circuitry 326, 328 are circuit and implementation dependent features, and either or both may be omitted in other designs.

The differential input ADC 316 converts the level shifted voltage representations to digital form (512), thereby providing a measurement, at the sampling instant, of the derivative current. The ADC 316 provides the digital measurement to error correction circuitry (514).

FIG. 4 illustrates main-path analog to digital conversion with derivative current measurement and error correction circuitry 400. A main-path ADC 402 (e.g., a 12 bit ADC) samples the analog input voltage, while the derivative current ADC 404 (e.g., a 7 bit ADC) generates digital measurements of the derivative current on the measurement output 406 at the sampling instant, e.g. using the circuitry shown in FIG. 3.

The main-path ADC 402 and derivative current ADC 404 may implement other bit resolutions. In some implementations, the 7 bit derivative current ADC 404 covers, e.g., 100 mV of derivative current signal level, quantized to the same noise level of the main-path ADC 402. That is, the error term may often be small compared to the main-path sample, and fewer bits (e.g., 7 bits) may cover a range that corrects a pre-determined number of least significant bits (e.g., 4) in the main-path sample.

The measurement output 406 provides derivative current measurements to the error correction circuitry 408. The error correction circuitry 408 includes an error calculation circuit 410 that receives the derivative current measurements and the main-path sample of the analog input voltage, after equalization by the equalization circuitry 412 (516). The error calculation circuit 410 outputs an error correction term to adder circuitry 414 (518), which in turn outputs the calibrated digital voltage sample of the analog input voltage on the calibrated sample output 416 (520). The calibrated sample returns to the error correction circuitry 410 through the least mean square (LMS) processor 418 and a gain circuit 420.

A digital-to-analog (DAC) converter 422 provides a linear reference for the calibration. To linearize the reference further, the analog output of the DAC 422 passes through a low pass filter (LPF) 424 to the LMS processor 418 and, through the buffer 426, to the subsequent circuitry shown in FIG. 4. The LMS processor 418 responsively determines the coefficients for the error calculation circuit 410 to minimize error in the calibrated sample output 416 compared to the reference input (522).

The equalization circuitry 412 calibrates for errors that may occur during the holding phase, such as gain error, incomplete settling, and leakage. The gain circuit 420 sets the step size of the LMS algorithm. The larger the step size, the faster the LMS algorithm converges, but with larger calibration inaccuracy. The error calculation circuit 410 evaluates the dynamic tracking error $R_{on(Vout)} \cdot C_s \cdot (dV_{out}/dt)$.

Figure 6:
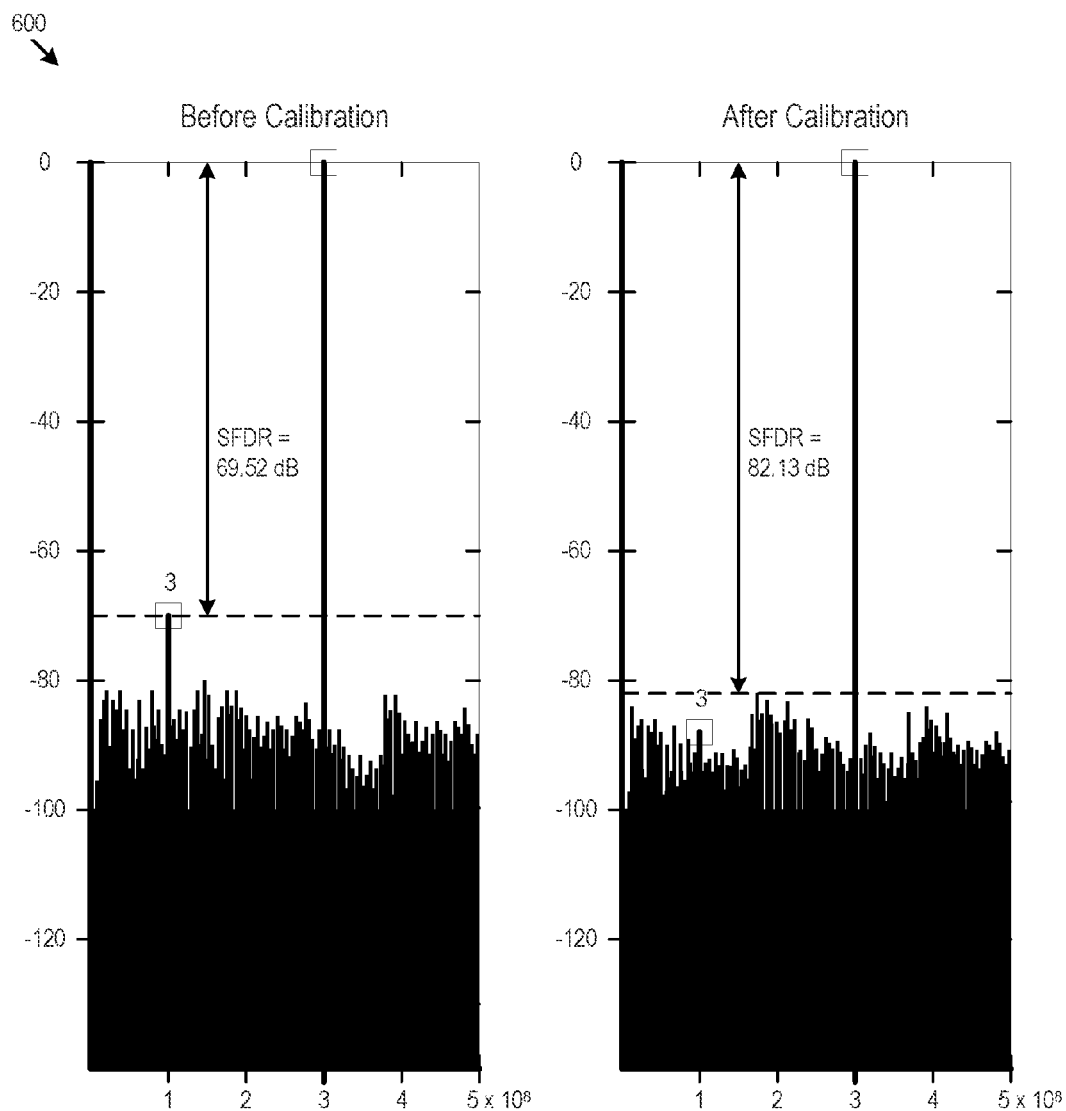
FIG. 6 shows one-tone calibration results.

FIG. 6 shows single tone calibration results 600. FIG. 6 shows a comparison of a single tone signal input to the system, before and after calibration, using the techniques described above. The $HD_3$ distortion measure, the strength of the third harmonic of the tone input, was reduced 20 dB. The spurious free dynamic range (SFDR) measure was reduced by 13 dB, dominated by higher order harmonics instead of $HD_3$.

Figure 7:
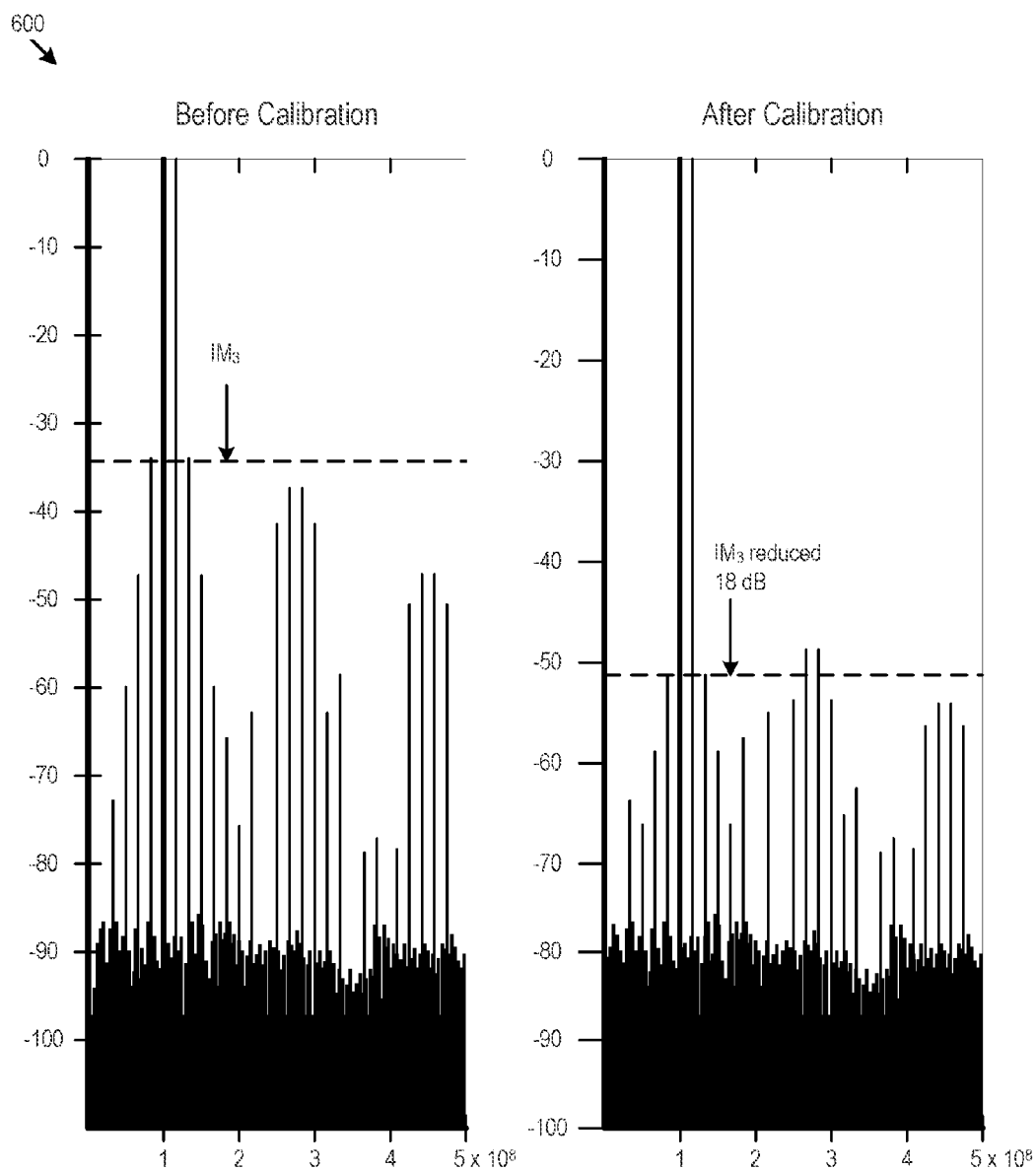
FIG. 7 shows two-tone calibration results.

FIG. 7 shows two tone calibration results 700. FIG. 7 also shows a comparison of a two tone signal input to the system, before after calibration, using the techniques described above. The $IM_3$ intermodulation distortion measure was reduced by 18 dB.

The methods, devices, processing, circuitry, and logic described above may be implemented in many different ways and in many different combinations of hardware and software. For example, all or parts of the implementations may be circuitry that includes discrete logic or other circuit components, including analog circuit components, digital circuit components or both; or any combination thereof. The circuitry may include discrete interconnected hardware components or may be combined on a single integrated circuit die, distributed among multiple integrated circuit dies, or implemented in a Multiple Chip Module (MCM) of multiple integrated circuit dies in a common package, as examples.

Various implementations have been specifically described. However, many other implementations are also possible.

What is claimed is:

1. A system comprising:
   analog-to-digital sample-and-hold circuitry comprising:
      a bottom plate transistor characterized by a non-linear resistance; and
      a top plate transistor coupled to a sampling capacitor;
   a late clock input coupled to the bottom plate transistor and operable to carry a late clock;
   an early clock input coupled to the top plate transistor, where the early clock input is operable to carry an early clock, with respect to the late clock; and
   an analog-to-digital converter (ADC) following the sampling capacitor, the ADC configured to:
      convert a derivative current flowing through the non-linear resistance and the sampling capacitor to a digital representation; and
      provide the digital representation on a sampling output.

2. The system of claim 1, where:
   the ADC comprises a converter clock input coupled to the early clock input.

3. The system of claim 1, further comprising:
   current-to-voltage conversion circuitry between the sampling capacitor and the ADC, the current-to-voltage conversion circuitry configured to convert the derivative current to a derivative voltage.

4. The system of claim 3, further comprising:
   level-shifting circuitry between the current-to-voltage conversion circuitry and the ADC, the level-shifting circuitry configured to adjust the derivative voltage for input compatibility with the ADC.

5. The system of claim 1, where:
   the ADC comprises a differential input ADC; and the analog-to-digital sample-and-hold circuitry is replicated in differential sampling branches comprising differential derivative current sampling outputs to the differential input ADC.

6. The system of claim 1, further comprising:
error correction circuitry coupled to the sampling output, where the error correction circuitry comprises an error calculation circuit and an adder circuit.

7. A system comprising:
an input buffer operable to receive an analog input signal;
a main-path analog-to-digital converter (ADC) coupled to the input buffer and operable to convert the analog input signal to a digital signal representation;
a derivative sampling circuit coupled to the input buffer, the derivative sampling circuit comprising:
analog-to-digital sample-and-hold circuitry comprising:
a bottom plate switch comprising a non-linear resistance;
a sampling capacitor; and
a top plate switch in series with the sampling capacitor;
a current sampling analog-to-digital converter (ADC) following the sampling capacitor, the current sampling ADC configured to:
convert a derivative current flowing through the non-linear resistance and the sampling capacitor to a digital representation; and
provide the digital representation on a sampling output to error correction circuitry;
a late clock input coupled to the bottom plate switch and operable to carry a late clock;
an early clock input coupled to the top plate switch, where the early clock input is operable to carry an early clock that is active before the late clock; and
where the error correction circuitry comprises:
an error calculation circuit;
an adder circuit coupled to a main-path ADC and the error calculation circuit; and
a least mean square processor coupled to the error calculation circuit.

8. The system of claim 7, further comprising:
current-to-voltage conversion circuitry between the sampling capacitor and the current sampling ADC, the current-to-voltage conversion circuitry configured to convert the derivative current to a derivative voltage;
level-shifting circuitry between the current-to-voltage conversion circuitry and the current sampling ADC, the level-shifting circuitry configured to adjust the derivative voltage for input compatibility with the current sampling ADC; and
where:
the current sampling ADC comprises a differential input ADC; and
the analog-to-digital sample-and-hold circuitry, the current-to-voltage conversion circuitry, and the level-shifting circuitry are replicated in differential sampling branches comprising differential derivative current sampling outputs to the differential input ADC.

9. A method comprising:
sampling an analog input signal with analog-to-digital sample-and-hold circuitry comprising:
a bottom plate transistor characterized by a non-linear resistance; and
a top plate transistor in series with a sampling capacitor;
late clocking the bottom plate transistor;
early clocking the top plate transistor; and
measuring derivative current with an analog-to-digital converter (ADC) following the sampling capacitor, by:
converting a derivative current flowing through the non-linear resistance and the sampling capacitor to a digital representation; and
providing the digital representation on a sampling output to error correction circuitry.

10. The method of claim 9, further comprising:
generating an early clock as an advance version of a late clock to carry out the late clocking and the early clocking.

11. The method of claim 10, further comprising:
clocking the ADC with the early clock.

12. The method of claim 9, further comprising:
performing current-to-voltage conversion between the sampling capacitor and the ADC, the current-to-voltage conversion converting the derivative current to a derivative voltage.

13. The method of claim 12, further comprising:
performing level-shifting between the current-to-voltage conversion circuitry and the ADC, the level-shifting adjusting the derivative voltage for input compatibility with the ADC.

14. The method of claim 9, where:
the ADC comprises a differential input ADC; and
the analog-to-digital sample-and-hold circuitry is replicated in differential sampling branches comprising differential derivative current sampling outputs to the differential input ADC.

15. The method of claim 9, further comprising:
processing the sampling output with error correction circuitry; and
correcting a main-path ADC output responsive to the processing.

16. The method of claim 15, where correcting the main-path ADC output comprises generating a calibrated sample output.

17. The method of claim 16, further comprising determining, after correcting the main-path ADC output, a filter coefficient for the error correction circuitry that produces a minimum error between the calibrated sample output and the analog input signal.

18. The method of claim 17, where determining the filter coefficient comprises processing the calibrated sample output and the analog input signal with a least mean square processor.

19. The system of claim 6, where the adder circuit comprises:
a first input coupled to the main-path ADC output; and
a second input coupled to the sampling output;
a calibrated sample output output coupled to the first and second inputs.

20. The system of claim 19, further comprising a least mean square processor configured to:
determine a filter coefficient for the error correction circuitry by comparing the calibrated sample output to an analog input signal used to generate the derivative current.

* * * * *